(12) United States Patent
Inazuki et al.

(10) Patent No.: US 11,860,529 B2
(45) Date of Patent: Jan. 2, 2024

(54) SUBSTRATE WITH MULTILAYER REFLECTION FILM FOR EUV MASK BLANK, MANUFACTURING METHOD THEREOF, AND EUV MASK BLANK

(71) Applicant: Shin-Etsu Chemical Co., Ltd., Tokyo (JP)

(72) Inventors: Yukio Inazuki, Joetsu (JP); Tsuneo Terasawa, Joetsu (JP); Takuro Kosaka, Joetsu (JP); Hideo Kaneko, Joetsu (JP); Kazuhiro Nishikawa, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 198 days.

(21) Appl. No.: 17/463,862

(22) Filed: Sep. 1, 2021

(65) Prior Publication Data
US 2022/0075255 A1 Mar. 10, 2022

(30) Foreign Application Priority Data

Sep. 10, 2020 (JP) .................................. 2020-151709

(51) Int. Cl.
G03F 1/24 (2012.01)
(52) U.S. Cl.
CPC ...................... G03F 1/24 (2013.01)
(58) Field of Classification Search
CPC .......................................................... G03F 1/24
USPC ............................................................ 430/5
See application file for complete search history.

(56) References Cited

U.S. PATENT DOCUMENTS

| 9,377,679 B2 * | 6/2016 | Hamamoto | ............... | G03F 1/24 |
| 10,254,640 B2 * | 4/2019 | Uno | ........... | G03F 1/24 |
| 2003/0140019 A1 | 7/2003 | Gutta et al. | | |
| 2008/0143981 A1 | 6/2008 | Ehm et al. | | |
| 2008/0318140 A1 | 12/2008 | Hayashi et al. | | |
| 2012/0225375 A1 | 9/2012 | Mikami | | |
| 2015/0160548 A1 | 6/2015 | Mikami | | |
| 2016/0147139 A1 | 5/2016 | Onoue et al. | | |
| 2017/0038673 A1 | 2/2017 | Ikebe et al. | | |
| 2017/0235218 A1 | 8/2017 | Uno | | |
| 2022/0075254 A1 * | 3/2022 | Inazuki | ................... | C23C 28/32 |

FOREIGN PATENT DOCUMENTS

| JP | 2004-331998 A | 11/2004 |
| JP | 2005-516282 A | 6/2005 |
| JP | 2012-54412 A | 3/2012 |
| JP | 2015-109366 A | 6/2015 |
| JP | 2015-122468 A | 7/2015 |
| JP | 2016-519778 A | 7/2016 |
| WO | WO 2011/071086 A1 | 6/2011 |
| WO | WO 2014/165300 A1 | 10/2014 |
| WO | WO 2015/012151 A1 | 1/2015 |

OTHER PUBLICATIONS

Partial European Search Report for corresponding European Application No. 21195102.5, dated Feb. 15, 2022.

* cited by examiner

Primary Examiner — Christopher G Young
(74) Attorney, Agent, or Firm — Birch, Stewart, Kolasch & Birch, LLP

(57) ABSTRACT

A substrate with a multilayer reflection film for an EUV mask blank including a substrate, and a multilayer reflection film formed on the substrate is provided. The multilayer reflection film includes a Si/Mo laminated portion and a protection layer containing Ru and including a lower layer composed of Ru, and an upper layer composed of a material containing Ru and at least one selected from the group consisting of metals other than Ru, and metalloids.

22 Claims, 4 Drawing Sheets

SUBSTRATE WITH MULTILAYER REFLECTION FILM FOR EUV MASK BLANK, MANUFACTURING METHOD THEREOF, AND EUV MASK BLANK

CROSS-REFERENCE TO RELATED APPLICATION

This non-provisional application claims priority under 35 U.S.C. § 119(a) on Patent Application No. 2020-151709 filed in Japan on Sep. 10, 2020, the entire contents of which are hereby incorporated by reference.

TECHNICAL FIELD

The present invention relates to an EUV mask blank which is a material for manufacturing an EUV mask used for manufacturing semiconductor devices such as LSIs, a substrate with a multilayer reflection film for an EUV mask blank used for manufacturing an EUV mask blank, and a manufacturing method thereof.

BACKGROUND ART

In a manufacturing process of semiconductor devices, a photolithography technique in which a circuit pattern formed on a transfer mask is transferred onto a semiconductor substrate (semiconductor wafer) through a reduction projection optical system with irradiating exposure light to the transfer mask is repeatedly used. Conventionally, a mainstream wavelength of the exposure light is 193 nm by argon fluoride (ArF) excimer laser light. A pattern with dimensions smaller than exposure wavelength has finally been formed by adopting a process called multi-patterning in which exposure processes and processing processes are combined multiple times.

However, since it is necessary to form a further fine pattern under continuous miniaturization of device patterns, EUV lithography technique using, as exposure light, EUV (extreme ultraviolet) light having a wavelength shorter than ArF excimer laser light was developed. EUV light is light having a wavelength of, for example, about 10 to 20 nm, more specifically, light having a wavelength of around 13.5 nm. This EUV light has a very low transmission to a substance and cannot be utilized for a conventional transmissive projection optical system or a mask, thus, reflection type optical elemental devices are applied. Therefore, a reflective mask is also proposed as a mask for the pattern transfer. The reflective mask includes a multilayer reflection film that is formed on a substrate and reflects EUV light, and a patterned absorber film that is formed on the multilayer reflection film and absorbs EUV light. Meanwhile, a material (also including a material in which a resist layer is formed) before patterning the absorber film is called a reflective mask blank, and this is used as a material for the reflective mask. Generally, a reflective mask and a reflective mask blank that reflect EUV light are referred to as an EUV mask and an EUV mask blank, respectively.

The EUV mask blank has a basic structure including a low thermal expansion substrate, a multilayer reflection film that is formed thereon and reflects EUV light, and an absorber film that is formed thereon and absorbs EUV light. As the multilayer reflection film, a Mo/Si multilayer reflection film which is obtained a necessary reflectance for EUV light by alternately laminating molybdenum (Mo) films and silicon (Si) films is usually used. Further, as a protection film for protecting the multilayer reflection film, a ruthenium (Ru) film or a film composed of a mixture of Ru and niobium (Nb) and/or zirconium (Zr) is formed as the outermost layer of the multilayer reflection film. On the other hand, as the absorber film, a material containing tantalum (Ta) or chromium (Cr) as a main component, which has a relatively large extinction coefficient with respect to EUV light, is used.

CITATION LIST

Patent Document 1: JP-A 2005-516282
Patent Document 2: WO 2015/012151 A1

SUMMARY OF THE INVENTION

For a protection layer formed as the uppermost layer of the multilayer reflection film, it is required that the multilayer reflection film including the protection layer which is combined with a Si/Mo laminated portion can provide a high reflectance to EUV light. Generally, when a thin protection layer is used, the reflectance is increased. However, if the protection layer is thin, when the multilayer reflection film is heated during mask processing or exposure with EUV light using the mask, oxygen in the air diffuses into the protection layer and reaches to the Si/Mo laminated portion, in particularly, silicon oxide is formed by the oxygen when the uppermost layer of the Si/Mo laminated portion is a Si layer, resulting decrease of reflectance. Further, in such a case, the protection layer may be peeled off by expansion due to the oxidation.

Further, in etching of an absorber film formed on the protection layer, or in etching for removing a hard mask film optionally formed as an etching mask for etching of the absorber film, it is required that the protection layer has resistance in the etching. For example, in the case of a Ta-based absorber film, dry etching using $Cl_2$ gas is used, and in the case of a Cr-based hard mask film, dry etching using $Cl_2$ gas and $O_2$ gas is used. On the other hand, Ru is etched by dry etching using an etching gas containing $O_2$ gas. Thus, a resistance of the protection layer to etching using an etching gas containing $O_2$ gas is ensured by a protection layer composed of a mixture of Ru and Nb or Zr. However, for the material in which Nb or Zr is added to Ru, Nb and Zr are easy to be oxidized, resulting easily roughening the surface of the protection layer. Further, oxygen in the air easily diffuses into the protection layer, so the above-mentioned problems are easy to occur. Therefore, it was difficult to thin such a protection layer.

The present invention has been made to solve the above problems, and an object of the present invention is to provide a substrate with a multilayer reflection film for an EUV mask blank including the multilayer reflection film that has necessary etching resistance and high reflectance, and is hard to be decreased reflectance when the multilayer reflection film is heated, a manufacturing method of the substrate, and an EUV mask blank including the substrate.

The inventors have been found that in a multilayer reflection film used for an EUV mask blank which is constructed by a Si/Mo laminated portion in which Si layers and Mo layers are alternately laminated, and a protection layer containing Ru formed in contact with the Si/Mo laminated portion, as the uppermost layer of the multilayer reflection film, when the protection layer is constructed by a lower layer composed of Ru and formed in contact with the Si/Mo laminated portion, and an upper layer composed of a material containing Ru and at least one selected from the group consisting of metals other than Ru, and metalloids and formed at the side remotest from the substrate, particularly, when the protection layer is contact with the Mo layer of the Si/Mo laminated portion, a substrate with a multilayer reflection film for an EUV mask blank, and an EUV mask blank have necessary etching resistance and high reflectance, and is hard to be decreased reflectance when the multilayer reflection film is heated.

Further, the inventors have been found that in forming the multilayer reflection film of a substrate with a multilayer reflection film for an EUV mask blank and a EUV mask blank, it is very important for achieving high reflectance that, after forming the Si/Mo laminated portion, the Mo/Si laminated portion is provided to formation of the protection film without contacting to gases reactable to the Mo/Si laminated portion.

In one aspect, the invention provides a substrate with a multilayer reflection film for an EUV mask blank including a substrate, and a multilayer reflection film formed on the substrate, wherein
  the multilayer reflection film includes a Si/Mo laminated portion in which Si layers and Mo layers are alternately laminated, and a protection layer containing Ru formed on the Si/Mo laminated portion and in contact with the Si/Mo laminated portion, as the uppermost layer,
  the protection layer includes a lower layer formed in contact with the Si/Mo laminated portion, and an upper layer formed at the side remotest from the substrate,
  the lower layer is composed of Ru, and
  the upper layer is composed of a material containing Ru and at least one selected from the group consisting of metals other than Ru, and metalloids.

Preferably, the metals other than Ru are transition metals having a low standard oxidation-reduction potential compared with that of Ru.

Preferably, the upper layer is composed of a material containing Ru and at least one selected from the group consisting of Nb, Zr, Ti, Cr and Si.

Preferably, the upper layer is composed of a material containing Ru and at least one selected from the group consisting of metals and metalloids that have a low etching rate compared with that of Ru in a dry etching using an etching gas containing $O_2$ gas and $Cl_2$ gas.

Preferably, the upper layer has a graded composition in which a content of the metal or metalloid continuously increases to the side remote from the substrate in the thickness direction of the upper layer, or the upper layer consists of two or more of sublayers and has a graded composition in which contents of the metal or metalloid of the sublayers increase in stepwise to the side remote from the substrate in the thickness direction of the upper layer.

Preferably, the upper layer further contains oxygen.

Preferably, a layer containing Si and N intervenes at one or more portions between the Si layer and the Mo layer of the Si/Mo laminated portion, and is contact with both of the Si layer and the Mo layer.

Preferably, the layer containing Si and N has a thickness of not more than 2 nm.

Preferably, the protection layer is contact with the Mo layer of the Si/Mo laminated portion.

Preferably, the uppermost part of the multilayer reflection film consists of, from the side remote from the substrate, the protection layer, the Mo layer, a layer containing Si and N, and the Si layer.

Preferably, in the uppermost part, the protection layer has a thickness of not more than 4 nm, the Mo layer has a thickness of not more than 1 nm, the layer containing Si and N has a thickness of not more than 2 nm, and the Si layer has a thickness of not more than 4 nm.

Preferably, the Si/Mo laminated portion includes not less than 30 of three-layer laminated structure units, and the three-layer laminated structure unit consists of, from the substrate side,
  i) the Si layer, a layer containing Si and N formed in contact with the Si layer, and the Mo layer formed in contact with the layer containing Si and N, or;
  ii) the Mo layer, a layer containing Si and N formed in contact with the Mo layer, and the Si layer formed in contact with the layer containing Si and N.

Preferably, the Si/Mo laminated portion includes not less than 30 of four-layer laminated structure units, and the four-layer laminated structure unit consists of, from the substrate side, the Si layer, a layer containing Si and N formed in contact with the Si layer, the Mo layer formed in contact with the layer containing Si and N, and a layer containing Si and N formed in contact with the Mo layer.

Preferably, the multilayer reflection film has a peak reflectance of not less than 65% with respect to EUV light of the wavelength range of 13.4 to 13.6 nm at an incident angle of 6°.

In another aspect, the invention provides a manufacturing method for the substrate with a multilayer reflection film for an EUV mask blank, the method including the step of
  (A) forming the Si/Mo laminated portion by sputtering, wherein
  the sputtering is performed by a magnetron sputtering apparatus including a chamber, wherein in the chamber,
  one or more Mo targets and one or more Si targets are attachable;
  powers are individually applicable to the Mo target and the Si target;
  the substrate and each of the targets are disposed in offset arrangement;
  none of shield members are disposed between the substrate and each of the targets;
  the substrate is rotatable along its main surface; and
  nitrogen-containing gas is introducible.

In another aspect, the invention provides a manufacturing method for the substrate with a multilayer reflection film for an EUV mask blank, the method including the step of
  (B) forming the protection layer by sputtering, wherein
  the sputtering is performed by a magnetron sputtering apparatus including a chamber, wherein in the chamber,
  one or more Ru targets and one or more targets containing at least one selected from the group consisting of metals other than Ru, and metalloids are attachable;
  powers are individually applicable to the Ru target and the target containing at least one selected from the group consisting of metals other than Ru, and metalloids;
  the substrate and each of the targets are disposed in offset arrangement;
  none of shield members are disposed between the substrate and each of the targets;
  the substrate is rotatable along its main surface; and
  oxygen-containing gas is introducible.

In another aspect, the invention provides a manufacturing method for the substrate with a multilayer reflection film for an EUV mask blank including a substrate, and a multilayer reflection film formed on the substrate, the multilayer reflection film including a Si/Mo laminated portion in which Si layers and Mo layers are alternately laminated, and a protection layer containing Ru formed on the Si/Mo laminated portion and in contact with the Si/Mo laminated portion,
  the method including the steps of
  (A) forming the Si/Mo laminated portion by sputtering, and (B) forming the protection layer by sputtering, wherein after the step (A), the Mo/Si laminated portion is provided to the step (B) without contacting to gases reactable to the Mo/Si laminated portion that has been formed in the step (A).

Preferably, the step (A) is performed in one sputter chamber, the substrate on which the Mo/Si laminated portion has been formed is transferred to the other sputter chamber, and then, the step (B) is performed in the other sputter chamber.

Preferably, a transfer chamber is provided between the one and other sputter chambers, the transfer chamber is capable of communicating with each of the sputter chambers individually or with both of the sputter chambers at the same time, and the substrate on which the Mo/Si laminated portion has been formed is transferred from the one sputter chamber via the transfer chamber to the other sputter chamber.

Preferably, the substrate is transferred under vacuum both in the transfer from the one sputter chamber to the transfer chamber, and the transfer from the transfer chamber to the other sputter chamber.

In another aspect, the invention provides an EUV mask blank including the substrate with a multilayer reflection film for an EUV mask blank, and an absorber film containing Ta or Cr formed on the multilayer reflection film.

In the other aspect, the invention provides an EUV mask blank including the substrate with a multilayer reflection film for an EUV mask blank, an absorber film containing Ta and being free of Cr formed on the multilayer reflection film, and a hard mask film which contains Cr and acts as an etching mask in dry etching for the absorber film.

Advantageous Effects of the Invention

According to the invention, a substrate with a multilayer reflection film for an EUV mask blank including the multilayer reflection film that has necessary etching resistance and high reflectance, and is hard to be decreased reflectance when the multilayer reflection film is heated, and an EUV mask blank including the substrate can be provided.

DESCRIPTION OF THE PREFERRED EMBODIMENT

A substrate with a multilayer reflection film for an EUV mask blank of the invention includes a substrate, and a multilayer reflection film formed on the substrate (on one main surface or the front surface of the substrate) and reflects exposure light, in particular, a multilayer reflection film that reflects EUV light. The multilayer reflection film may be formed in contact with the one main surface of the substrate. Further, an undercoat film may be formed between the substrate and the multilayer reflection film. A wavelength of EUV light used for EUV lithography using EUV light as exposure light is 13 to 14 nm, and is usually light having a wavelength of about 13.5 nm (for example, 13.4 to 13.6 nm).

Figure 1:
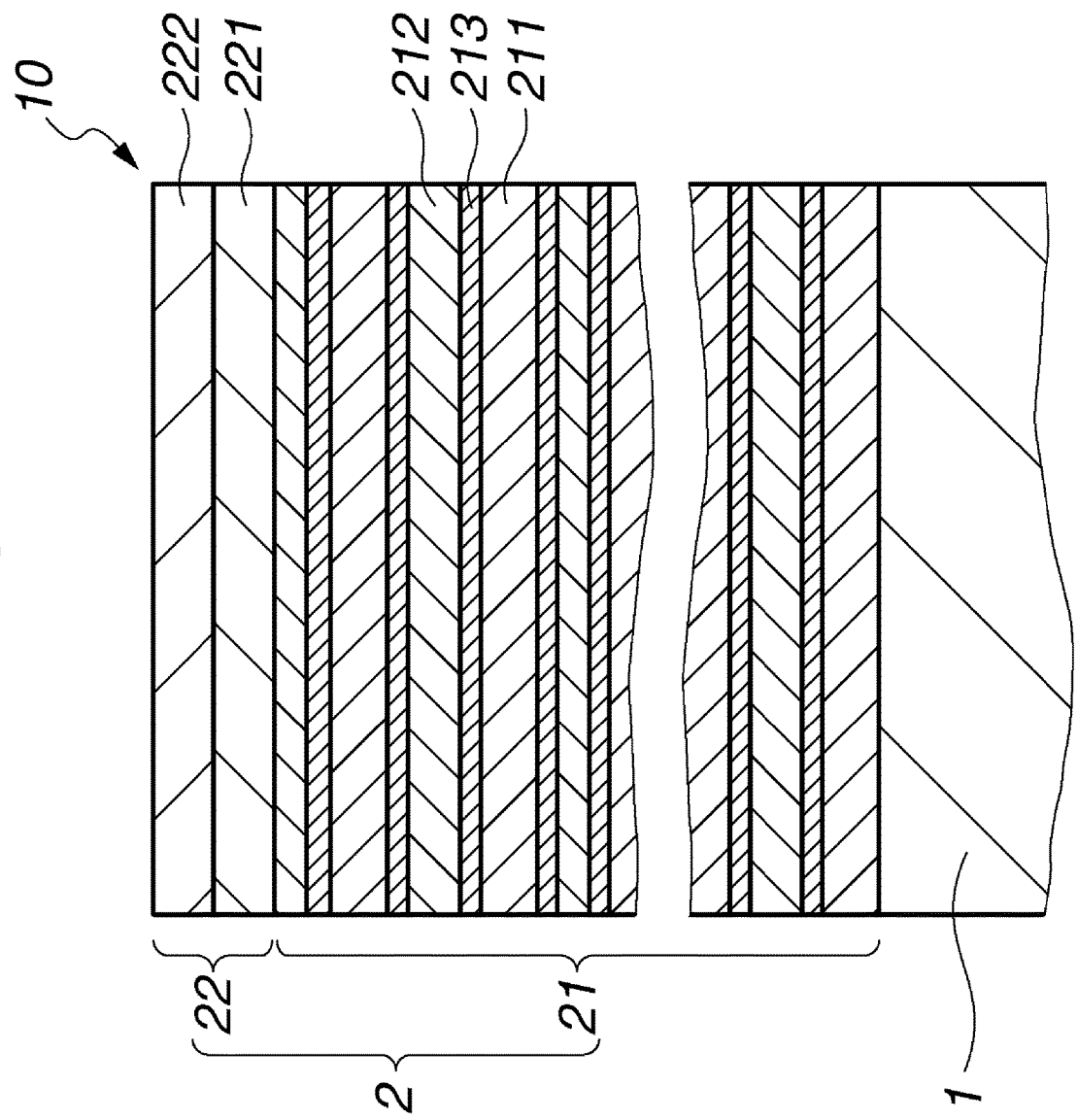
FIG. 1 is an intermediate omitted partial cross-sectional view of an example of a substrate with a multilayer reflection film for an EUV mask blank of the invention.

FIG. 1 is an intermediate omitted partial cross-sectional view of an example of a substrate with a multilayer reflection film for an EUV mask blank of the invention. The substrate with a multilayer reflection film for an EUV mask blank 10 includes a multilayer reflection film 2 formed on one main surface and in contact with the one main surface of the substrate 1.

The substrate preferably has low thermal expansion property, and, for example, the substrate is preferably composed of a material having a coefficient of thermal expansion within $\pm 2\times 10^{-8}/C°$, preferably $\pm 5\times 10^{-9}/C°$. Further, a substrate which is sufficiently flattened is preferably used, a surface roughness RMS of the main surface of the substrate is preferably not more than 0.5 nm, more preferably not more than 0.2 nm. Such a surface roughness can be obtained by polishing the substrate.

The multilayer reflection film in an EUV mask is a film that reflects EUV light as exposure light. In the invention, the multilayer reflection film includes a Si/Mo laminated portion consisting of multiple layers in which Si (silicon) layers and Mo (molybdenum) layers are alternately laminated. In the Si/Mo laminated portion, a Si layer composed of a material having a relatively high refractive index with respect to EUV light, and a Mo layer composed of a material having a relatively low refractive index with respect to EUV light are periodically laminated. The Si layer and the Mo layer are layers formed of a simple substance of silicon and a simple substance of molybdenum, respectively. The number of laminated layers of the Si layer and the Mo layer is preferably, for example, not less than 40 cycles (not less than 40 layers, respectively), and preferably not more than 60 cycles (not more than 60 layers, respectively). A thickness of the Si layer and the Mo layer of the Si/Mo laminated portion is appropriately set according to the exposure wavelength. The thickness of the Si layer is preferably not more than 5 nm, and the thickness of the Mo layer is not more than 4 nm. A lower limit of the thickness of the Si layer is normally not less than 1 nm, however, not limited thereto. A lower limit of the thickness of the Mo layer is normally not less than 1 nm, however, not limited thereto. The thickness of the Si layer and the Mo layer may be set so as to obtain a high reflectance for EUV light. Further, the thickness of each of the Si layers and each of the Mo layers may be constant or different in each layer. A total thickness of the Si/Mo laminated portion is normally about 250 to 450 nm.

In the invention, a layer containing Si and N preferably intervenes at one or more portions between the Si layer and the Mo layer of the Si/Mo laminated portion, and is preferably contact with both of the Si layer and the Mo layer. The layer containing Si and N is preferably free of oxygen. As the layer containing Si and N, in particular, SiN layer is preferable. Here, "SiN" means that the constituent elements are only Si and N. A nitrogen content of the layer containing Si and N is preferably not less than 1 at %, more preferably not less than 5 at %, and not more than 60 at %, more preferably not more than 57 at %. The layer containing Si and N has a thickness of preferably not more than 2 nm, more preferably not more than 1 nm. A lower limit of the thickness of the layer containing Si and N is preferably not less than 0.1 nm, however not limited thereto.

The layer containing Si and N is preferably formed at one or more portions between the Si layer and the Mo layer constituting the Si/Mo laminated portion. The layer containing Si and N may be formed at a part or all of the substrate side (lower side) of the Mo layer, and a part or all of the side remote from the substrate (upper side) of the Mo layer. The layer containing Si and N is more preferably formed at all portions between the Si layer and the Mo layer.

Particularly, in the viewpoint of obtaining high reflectance, the Si/Mo laminated portion preferably includes not less than 30, more preferably not less than 40 of three-layer laminated structure units. The three-layer laminated structure unit consist of, from the substrate side; i) the Si layer, the layer containing Si and N formed in contact with the Si layer, and the Mo layer formed in contact with the layer containing Si and N, or; ii) the Mo layer, the layer containing Si and N formed in contact with the Mo layer, and the Si layer formed in contact with the layer containing Si and N. Further, the Si/Mo laminated portion preferably includes not less than 30, more preferably not less than 40 of four-layer laminated structure units. The four-layer laminated structure unit consists of, from the substrate side, the Si layer, the layer containing Si and N formed in contact with the Si layer, the Mo layer formed in contact with the layer containing Si and N, and a layer containing Si and N formed in contact with the Mo layer. Upper limits of the three-layer laminated structure unit and the four-layer laminated structure units are not more than 60, respectively.

In the invention, the Si/Mo laminated portion shown in FIG. 1 is exemplified as a concrete example. In the multilayer reflection film 2 of the substrate with a multilayer reflection film for an EUV mask blank 10 shown in FIG. 1, the Si/Mo laminated portion 21 is formed in contact with the substrate 1. In the Si/Mo laminated portion 21, the Si layers 211 and the Mo layers 212 are alternately laminated. In this case, the Si layer 211 is disposed at the side closest to the substrate 1, and the Mo layer 212 is disposed at the side remotest from the substrate 1. Further, the layer containing Si and N 213 is formed at each of the portions between the Si layer 211 and the Mo layer 212, and the layer containing Si and N 213 is contact with the Si layer 211 and the Mo layer 212. Thus, in this case, the Si/Mo laminated portion 21 includes the three-layer laminated structure unit consist of, from the substrate side, the Si layer 211, the layer containing Si and N 213, and the Mo layer 212, and the three-layer laminated structure unit consist of, from the substrate side, the Mo layer 212, the layer containing Si and N 213, and the Si layer 211. Further, the Si/Mo laminated portion 21 includes the four-layer laminated structure unit consist of, from the substrate side, the Si layer 211, the layer containing Si and N 213, the Mo layer 212, and the layer containing Si and N 213.

Figure 2:
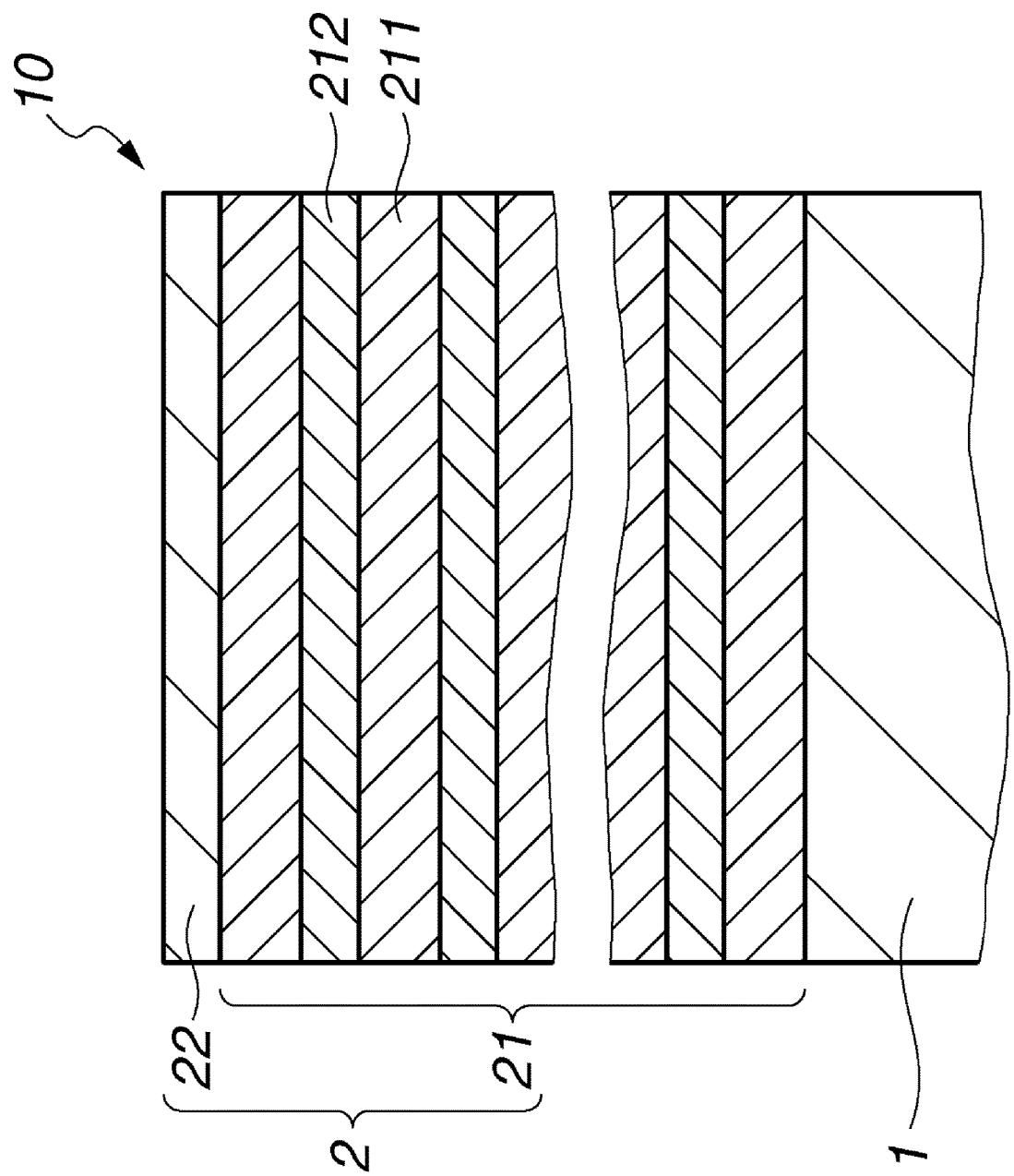
FIG. 2 is an intermediate omitted partial cross-sectional view for explaining a substrate with a multilayer reflection film for an EUV mask blank including an ideal multilayer reflection film consisting of a Si/Mo laminated portion and a protection layer.
Figure 3:
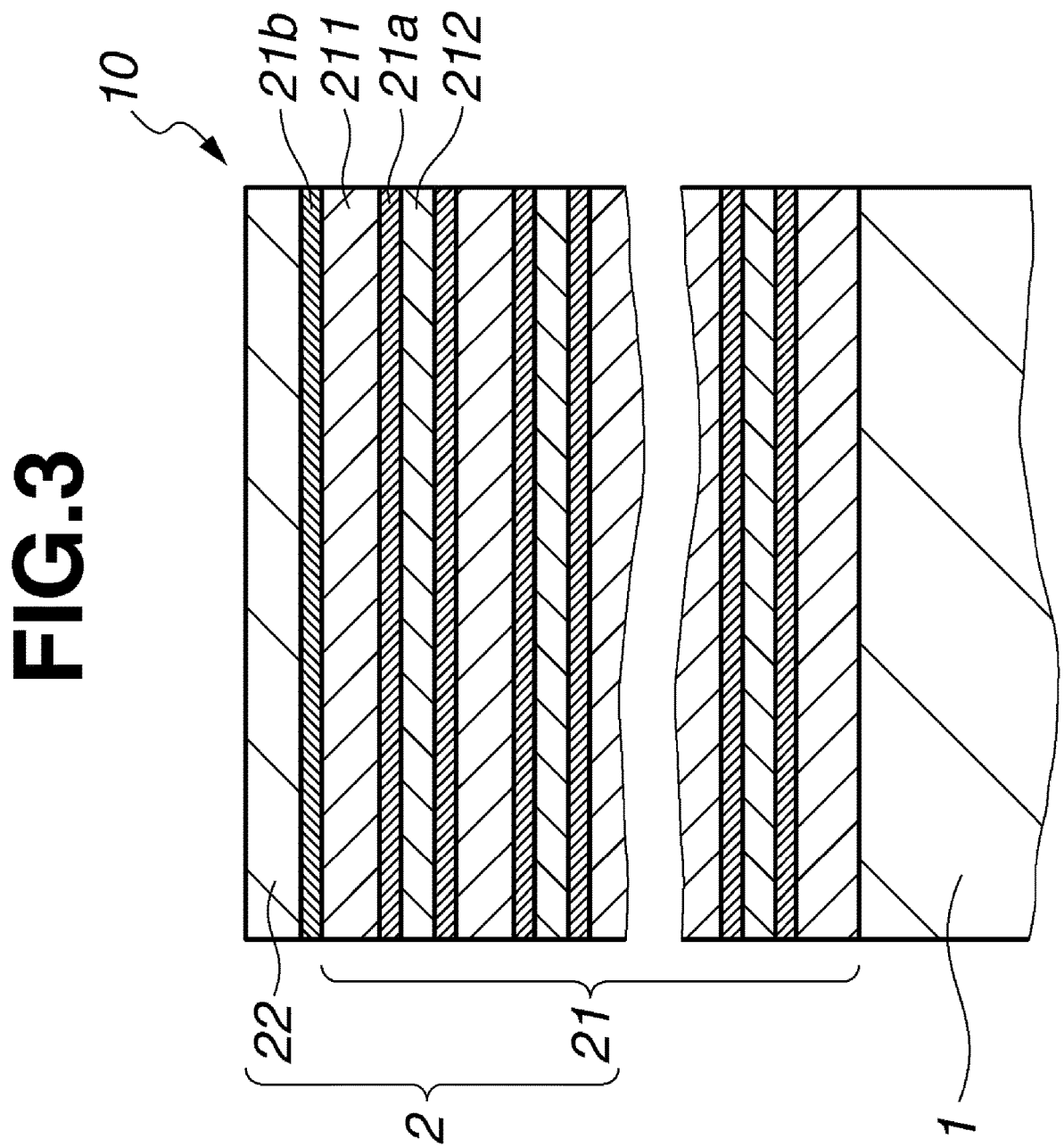
FIG. 3 is an intermediate omitted partial cross-sectional view for explaining a reflective mask blank including a conventional multilayer reflection film consisting of a Si/Mo laminated portion and a protection layer.

The Si/Mo laminated portion is formed by alternately laminating the Si layers and the Mo layers. FIG. 2 is an intermediate omitted partial cross-sectional view for explaining a substrate with a multilayer reflection film for an EUV mask blank including an ideal multilayer reflection film consisting of a Si/Mo laminated portion and a protection layer. FIG. 3 is an intermediate omitted partial cross-sectional view for explaining a reflective mask blank including a conventional multilayer reflection film consisting of a Si/Mo laminated portion and a protection layer. In case that the Si/Mo laminated portion 21 of the multilayer reflection film 2 of the substrate with a multilayer reflection film for an EUV mask blank 10 is formed by laminating directly on the Si layers and the Mo layers each other, the state of the Si/Mo laminated portion 21 consisting of only the Si layers 211 and the Mo layers 212 in which the Si layers and the Mo layers are contacted each other is ideal, as shown in FIG. 2. In such a Si/Mo laminated portion 21, a theoretical reflectance can be obtained by the Si/Mo laminated portion consisting of only the Si layers and the Mo layers.

It is not impossible in principle to form the Si/Mo laminated portion having this structure. However, when the Si/Mo laminated portion is formed by a realistic method, in reality, as shown in FIG. 3, Si and Mo are mixed at the portion where the Si layer 211 and the Mo layer 212 are contacted each other, and as a result, an interdiffusion layer 21a consisting of Si and Mo is unintentionally formed at this portion. When such an interdiffusion layer consisting of Si and Mo is formed, a reflectance of the Si/Mo laminated portion is decreased from the theoretical reflectance obtained by the Si/Mo laminated portion consisting of only the Si layers and the Mo layers. Further, when the multilayer reflection film is heated in mask processing or in exposure by EUV light using a mask, the interdiffusion layer consisting of Si and Mo becomes thicker, or the interdiffusion layer consisting of Si and Mo changes in its nature, resulting in further decrease of reflectance.

On the other hand, when the layer containing Si and N is formed between the Si layer and the Mo layer and in contact with both of the Si layer and the Mo layer, formation of the interdiffusion layer consisting of Si and Mo that causes reduction of reflectance is suppressed. Therefore, reduction of reflectance from the theoretical reflectance obtained by the Si/Mo laminated portion consisting of only the Si layers and the Mo layers is suppressed, and a high reflectance is accomplished in compared with a conventional reflectance. In addition, the portion between the Si layer and the Mo layer where the layer containing Si and N is not formed, the above-mentioned interdiffusion layer consisting of Si and Mo is normally formed in contact with both of the Si layer and the Mo layer. However, in the Si/Mo laminated portion of the multilayer reflection film of the invention, formation of the interdiffusion layer consisting of Si and Mo is suppressed at the portion between the Si layer and Mo layer where the layer containing Si and N is formed. Therefore, reduction of reflectance caused by heat is suppressed in compared with the conventional multilayer refection film in which the interdiffusion layer consisting of Si and Mo is formed at all of the portions between the Si layer and the Mo layer. From this point of view, the layer containing Si and N may be formed a part of the portions between the Si layer and Mo layer. However, it is advantageous that the layers containing Si and N are formed at many of the portions between the Si layer and the Mo layer, and it is particularly advantageous that the layers containing Si and N are formed at all of the portions between the Si layer and the Mo layer.

In the invention, the multilayer reflection film includes a protection layer formed in contact with the Si/Mo laminated portion, as the uppermost layer. When the uppermost layer is the Si layer or the Mo layer, the layer is etched by dry etching using a fluorine-containing gas. Therefore, it is effective that the protection layer is formed on the Si/Mo laminated portion. The protection layer is also called a capping layer, and acts as an etching stopper when forming an absorber pattern from an absorber film formed on the protection layer. Therefore, a material having different etching properties from that of the absorber film is used for the protection layer. The protection layer is preferably effective also for protecting the multilayer reflection film when correcting the absorber pattern.

In the invention, the protection layer includes a lower layer formed in contact with the Si/Mo laminated portion, and an upper layer formed at the side remotest from the substrate. The protection layer shown in FIG. 1 is exemplified as a concrete example. In the multilayer reflection film 2 of the substrate with a multilayer reflection film for an EUV mask blank 10, the protection layer 22 is formed in contact with the Si/Mo laminated portion 21, and the protection layer 22 consists of, from the side of the substrate 1, the lower layer 221 and the upper layer 222.

As a material for the protection layer, a material containing ruthenium (Ru) is used. The lower layer is a layer composed of Ru (Ru layer), and the upper layer is composed of a material containing Ru and at least one selected from the group consisting of metals other than Ru, and metalloids. According to the feature, it is possible to suppress diffusion of oxygen from the protection layer to the Si/Mo laminated portion, and to improve etching properties and to impart cleaning resistance. The metals other than Ru are preferably metals having a low standard oxidation-reduction potential (expressed in formula of $Ru^{2+}+2e^-\leftrightarrow Ru$) compared with that of Ru, particularly, metals that are easy to form oxides compared with Ru when the metal is mixed with Ru. The metals other than Ru are more preferably transition metals. As the metals other than Ru, Nb, Zr, Ti, Cr, and other metals are preferable, and as the metalloids, Si and other metalloids are preferable. A layer containing at least one selected from the group consisting of metals other than Ru, and metalloids preferably contains at least one of these together with Ru. According to the feature, when the protection layer is oxidized from the side remote from the Si/Mo laminated portion, the metalloid or the metal having a standard oxidation-reduction potential lower than that of Ru in the upper layer is oxidized first. As a result, the lower layer composed of Ru can be protected by the upper layer, oxygen is prevented from reaching the lower layer, and oxidation of the lower layer can be suppressed. Further, it is possible to suppress diffusion of oxygen into the Si/Mo laminated portion formed in contact with the protection layer (lower layer).

In the upper layer, a content (at %) of the at least one selected from the group consisting of metals other than Ru, and metalloids is preferably the same or less than a content of Ru. A lower limit of the content (at %) of the at least one selected from the group consisting of metals other than Ru, and metalloids is preferably not less than 0.1 at %, more preferably not less than 1 at %, however, not limited thereto. The upper layer may further contain another element other metals and metalloids. Particularly, the upper layer may contain oxygen since the metalloids and metals having a low standard oxidation-reduction potential compared with that of Ru are stabilized by oxidation.

The upper layer is preferably composed of a material containing Ru and at least one selected from the group consisting of metals and metalloids that have a low etching rate compared with that of Ru in a dry etching using an etching gas containing $O_2$ gas, particularly, an etching gas containing $O_2$ gas and $Cl_2$ gas. When the protection layer is a Ru layer, the Ru layer is etched by a dry etching using an etching gas containing $O_2$ gas. On the other hand, when the protection layer is a layer composed of a mixture of Ru, and Nb and/or Zr, resistance to a dry etching using an etching gas containing $O_2$ gas, particularly, a dry etching using an etching gas containing $O_2$ gas and $Cl_2$ gas, which is regularly applied as an etching to a chromium-containing material, and resistance to $O_3$ gas), which is used in a mask manufacturing process, are ensured. However, in a Ru material in which Nb and/or Zr are added, Nb and Zr are easily oxidized, thus, the surface of the protection layer is easily roughened. Further, oxygen in the air easily diffuses into the protection layer, thus, oxygen reaches to the Si/Mo laminated portion. In particular, when the uppermost layer of the Si/Mo laminated portion is the Si layer, silicon oxide is formed and the reflectance is decreased. In such a case, the protection layer may expand and be peeled off due to oxidation. Moreover, since the multilayer reflection film is required to have high reflectance, it is advantageous that the protection layer composed of a material containing Ru having a large extinction coefficient is thin. Meanwhile, it is preferable that the thickness of the protection layer is thick for the above-mentioned oxygen diffusion. Therefore, there is a limit to reduce the thickness of the protection layer in which the whole of the layer is formed by only the Ru material in which Nb and/or Zr are added.

In the invention, the upper layer composed a material containing Ru and at least one selected from the group consisting of metals and metalloids that have a low etching rate compared with that of Ru in a dry etching using an etching gas containing $O_2$ gas, particularly, a dry etching using an etching gas containing $O_2$ gas and $Cl_2$ gas, which is regularly applied as an etching to a chromium-containing material, is disposed at the side remotest from the substrate in the protection layer. Further, the lower layer composed of Ru is disposed at the contacting side to the Si/Mo laminated portion in the protection layer. According to the features, resistance to a dry etching using an etching gas containing $O_2$ gas, particularly, a dry etching using an etching gas containing $O_2$ gas and $Cl_2$ gas, and resistance to $O_3$ gas), which is used in a mask manufacturing process, are ensured. Further, oxygen is prevented from reaching the lower layer by the upper layer containing a metal that is easy to form oxides compared with Ru. Moreover, it is possible to suppress the diffusion of oxygen from the protection layer to the Si/Mo laminated portion by contacting the lower layer composed of Ru with the Si/Mo laminated portion. Accordingly, the multilayer reflection film has necessary etching resistant and a high reflectance.

A thickness of the protection layer is normally not more than 5 nm, in particular, preferably not more than 4 nm. A lower limit of the thickness of the protection layer is normally not less than 2 nm. In the thickness of the protection layer, a thickness of the lower layer is preferably not less than 0.5 nm, more preferably not less than 1 nm, and preferably not more than 2 nm, more preferably not more than 1.5 nm, and a thickness of the upper layer is preferably not less than 0.5 nm, more preferably not less than 1 nm, and preferably not more than 3 nm, more preferably not more than 2 nm.

The upper layer of the protection layer of the invention may be, respectively, a layer having a single composition (composition not varying in the thickness direction), a layer having a graded composition in which a content of the metal or metalloid continuously increases to the side remote from the substrate in the thickness direction, or a layer consisting of two or more of sublayers and having a graded composition in which contents of the metal or metalloid of the sublayers increase in stepwise to the side remote from the substrate in the thickness direction. Among them, the layers having a graded composition are preferable. When the upper layer consists of two or more of sublayers, each of the sublayers may contain a different kind of the metal or metalloid each other.

In the Si/Mo laminated portion, the layer disposed at the side closest to the substrate may be the Si layer or the Mo layer. On the other hand, the layer disposed at the side remotest from the substrate may be the Si layer or the Mo layer, however, the Mo layer is preferable. The layer contacted to the protection layer in the Si/Mo laminated portion is preferably the Mo layer.

In case that the layer contacted to the protection layer in the Si/Mo laminated portion is the Si layer, when the protection layer composed of a material containing Ru is directly contacted to the Si/Mo laminated portion, a state in which the Si layer 211 of the Si/Mo laminated portion 21 and the protection layer 22 are contacted each other, as shown in FIG. 2, is ideal. In such a state, decrease of reflectance in the multilayer reflection film 2 due to the protection layer 22 is limited, and a high reflectance can be obtained.

It is not impossible in principle to form the state. However, when the protection layer is formed by a realistic method, in reality, as shown in FIG. 3, Si and Ru are mixed at the portion where the Si layer 211 and the protection layer 22 are contacted each other, and as a result, an interdiffusion layer 21b consisting of Si and Ru is unintentionally formed at this portion. When such an interdiffusion layer consisting of Si and Ru is formed, a reflectance is decreased due to the interdiffusion layer 21b. Further, when the multilayer reflection film is heated in mask processing or in exposure by EUV light using a mask, the interdiffusion layer consisting of Si and Ru becomes thicker, or the interdiffusion layer consisting of Si and Ru changes in its nature. Further, when the protection layer composed of a material containing Ru is exposed to the air, not only the protection layer but also the Si layer is oxidized, resulting in a further decrease of reflectance.

On the other hand, as shown in FIG. 1, when the Mo layer 212 in the Si/Mo laminated portion 21 is contacted to the protection layer 22, the interdiffusion layer consisting of Si and Ru that causes decrease of reflectance is not formed between the Si/Mo laminated portion and the protection layer composed of a material containing Ru. Thus, a high reflectance is achieved in compared with the case in which the Si layer in the Si/Mo laminated portion is contacted to the protection layer. At the same time, crystallinity of the Ru layer contacted to Mo is improved, and a dense Ru layer can be obtained.

When the Mo layer in the Si/Mo laminated portion is contacted to the protection layer, the layer containing Si and N is preferably formed between the closest Si layer, and the Mo layer contacted to the protection layer, and in contact with both of the Si layer and the Mo layer. In particular, the uppermost part of the multilayer reflection film preferably consists of, from the side remote from the substrate, the protection layer, the Mo layer, the layer containing Si and N, and the Si layer. The portion between the Si layer closest to the Mo layer in the Si/Mo laminated portion contacted to the protection layer, and the Mo layer contacted to the protection layer is easily affected by the protection layer. Further, when the multilayer reflection film is heated, this portion is most susceptible to the influence of heat, so this portion has highest potential for generating the interdiffusion layer composed of Si and Mo. Therefore, it is particularly effective for obtaining a high reflectance that the layer containing Si and N is formed between the Si layer and the Mo layer in the uppermost part of the multilayer reflection film.

In this case, by forming the layer containing Si and N, even when the Mo layer contacted to the protection layer composed of a material containing Ru is formed thin, the protection layer composed of a material containing Ru, particularly, the lower layer becomes a stable state having a crystalline dense structure by forming the protection layer composed of a material containing Ru on the Mo layer even when the protection layer composed of a material containing Ru is comparatively thin. Therefore, a thickness of the Mo layer contacted to the protection layer composed of a material containing Ru is preferably not more than 2 nm, more preferably not more than 1 nm. Particularly, when the uppermost part of the multilayer reflection film consists of, from the side remote from the substrate, the protection layer, the Mo layer, the layer containing Si and N, and the Si layer, the protection layer preferably has a thickness of not more than 4 nm, the Mo layer preferably has a thickness of not more than 1 nm, the layer containing Si and N preferably has a thickness of not more than 2 nm, and the Si layer preferably has a thickness of not more than 4 nm.

In the invention, with respect to a reflectance of the multilayer reflection film, the multilayer reflection film may have a peak reflectance of not less than 65% with respect to EUV light of the wavelength range of 13.4 to 13.6 nm at an incident angle of 6°. Even if the multilayer reflection film is heat-treated, for example, in the air at 200° C. for 10 minutes, the change (decrease) of the reflectance is small, and even after the heat treatment, the peak reflectance can be maintained in the range of not less than 65%.

Examples of methods for forming the Si/Mo laminated portion include a sputtering method in which, to perform sputtering, power is supplied to a target, and plasma of an atmospheric gas is formed (an atmospheric gas is ionized) by the supplied power, and an ion beam sputtering method in which a target is irradiated with ion beam. The sputtering methods include a DC sputtering method in which a DC voltage is applied to a target, and an RF sputtering method in which a high frequency voltage is applied to a target. The sputtering method is a film forming method that utilizes sputtering phenomenon of gas ions by applying a voltage to a target with feeding a sputter gas into a chamber to ionize the gas. Particularly, a magnetron sputtering method has an advantage in productivity. The power may be applied to the target by a DC system or an RF system. The DC system also includes a pulse sputtering that inverts a negative bias applied to the target for a short time in order to prevent charge-up of the target.

The Si/Mo laminated portion can be formed by a sputtering method using a sputtering apparatus to which a plurality of targets can be attached. The Si layer, the layer containing Si and N, and the Mo layer can be sequentially formed in sequential sputtering of a silicon (Si) target and a molybdenum (Mo) target. In particular, these layers may be formed by using the silicon (Si) target for forming the Si layer and the layer containing Si and N, and the molybdenum (Mo) target for forming the Mo layer; using, as a sputter gas, rare gas such as helium (He) gas, argon (Ar) gas, krypton (Kr) gas and xenon (Xe) gas in the case of forming the Si layer or the Mo layer, or the rare gas with a nitrogen-containing gas such as nitrogen gas ($N_2$) gas in the case of forming the layer containing Si and N; and disposing the substrate and each of the targets in offset arrangement in which the vertical line passing through the center of the sputtering surface of each target does not match with the vertical line passing through the center of the film forming surface of the substrate. The sputtering is preferably performed while rotating the substrate along its main surface. Further, in this case, it is preferable that none of shield members such as shutters which shield between the substrate and the target are disposed. In addition, the layer containing Si and N may be formed by a reactive sputtering using a nitrogen-containing gas, or by using a silicon compound target such as silicon nitride target as the target.

The Si/Mo laminated portion can be formed by a method including step (A): forming the Si/Mo laminated portion by sputtering. In this case, the sputtering is preferably performed by a magnetron sputtering apparatus including a chamber. Preferably, in this chamber, one or more Mo targets and one or more Si targets are attachable; powers are individually applicable to the Mo target and the Si target; the substrate and each of the targets are disposed in offset arrangement; none of shield members are disposed between the substrate and each of the targets; the substrate is rotatable along its main surface; and nitrogen-containing gas is introducible.

The protection layer can be formed by, for example, a sputtering method such as an ion beam sputtering and a magnetron sputtering, as same in the case of the Si/Mo laminated portion. However, a magnetron sputtering method has an advantage, as same in the case of the Si/Mo laminated portion.

The protection layer can be formed by a sputtering method using a sputtering apparatus to which a plurality of targets can be attached. In particular, the protection layer is formed by using a ruthenium (Ru) target, a target composed of metal other than Ru, or metalloid (for example, niobium (Nb), zirconium (Zr), titanium (Ti), chromium (Cr), silicon (Si), or the like), or a target composed of ruthenium (Ru), and metal other than Ru, or metalloid (for example, niobium (Nb), zirconium (Zr), titanium (Ti), chromium (Cr), silicon (Si), or the like); using, as a sputter gas, a rare gas such as helium (He) gas, argon (Ar) gas, krypton (Kr) gas and xenon (Xe) gas and an optional reactive gas such as an oxygen-containing gas, a nitrogen-containing gas and a carbon-containing gas; disposing the substrate and each of the targets in offset arrangement; and sputtering a single target, or multiple targets simultaneously. The sputtering is preferably performed while rotating the substrate along its main surface.

For example, the lower layer can be formed by sputtering using a Ru target and a rare gas as a sputter gas. On the other hand, the upper layer can be formed by sputtering using a Ru target and a target containing one or more kinds of metals other than Ru, and/or metalloids, and a rare gas as a sputter gas. Particularly, when a plurality of targets are simultaneously sputtered, a layer having a graded composition can be formed by continuously or stepwise varying a ratio of power applied to each of the targets.

When the upper layer of the protection layer is formed by a compound further containing another element other than metal and metalloid, the upper layer can be formed by reactive sputtering using, as a sputter gas, a reactive gas such as an oxygen-containing gas, a nitrogen-containing gas and a carbon containing gas together with a rare gas. Particularly, when a layer containing oxygen is formed, it is preferable to use oxygen gas ($O_2$ gas). Further, a target composed of a compound may also be used.

The protection layer can be formed by a method including step (B): forming the protection layer by sputtering. In this case, the sputtering is preferably performed by a magnetron sputtering apparatus including a chamber. Preferably, in this chamber, one or more Ru targets and one or more targets containing at least one selected from the group consisting of metals other than Ru, and metalloids are attachable; powers are individually applicable to the Ru target and the target containing at least one selected from the group consisting of metals other than Ru, and metalloids; the substrate and each of the targets are disposed in offset arrangement; none of shield members are disposed between the substrate and each of the targets; the substrate is rotatable along its main surface; and oxygen-containing gas is introducible.

In this way, the multilayer reflection film can be suitably formed by the step (A): forming the Si/Mo laminated portion by sputtering, and the step (B): forming the protection layer by sputtering. In this case, for example, the step (A) is performed in one sputter chamber, the substrate on which the Mo/Si laminated portion has been formed is transferred from the one sputter chamber to the other sputter chamber, and then, the step (B) is performed in the other sputter chamber. However, if the Si/Mo laminated portion is exposed in, for example, an atmosphere containing oxygen such as the air, an unnecessary oxide layer is formed at the portion between the Si/Mo laminated portion and the protection layer, resulting decrease of reflectance and causing peel at the portion of them in some cases. Therefore, when shifting to the step (B) after the step (A), it is preferable that none of gases reactable to the Mo/Si laminated portion, particularly none of oxygen-containing gases such as oxygen gas ($O_2$ gas) are contacted to the Mo/Si laminated portion that has been formed in the step (A), in particular, without exposing the Mo/Si laminated portion to the air until shifting to the step (B), then the step (B) is performed.

When the step (A) is performed in one sputter chamber, and the substrate on which the Mo/Si laminated portion has been formed is transferred from the one sputter chamber to the other sputter chamber, and then the step (B) is performed in the other sputter chamber, as a method for performing the step (B) without contacting the Si/Mo laminated portion formed in the step (A) with gases which are reactable to the Mo/Si laminated portion, examples of the method include a method in which a transfer chamber capable of communicating with each of the sputter chambers individually or with both of the sputter chambers at the same time is provided between the one and other sputter chambers, and in which the substrate on which the Mo/Si laminated portion has been formed is transferred from the one sputter chamber via the transfer chamber to the other sputter chamber. At this time, both of the transfer from the one sputter chamber to the transfer chamber and the transfer from the transfer chamber to the other sputter chamber are preferably performed under an inert gas atmosphere at a normal pressure (atmospheric pressure) or a reduced pressure (lower pressure than normal pressure), or under vacuum.

Figure 4:
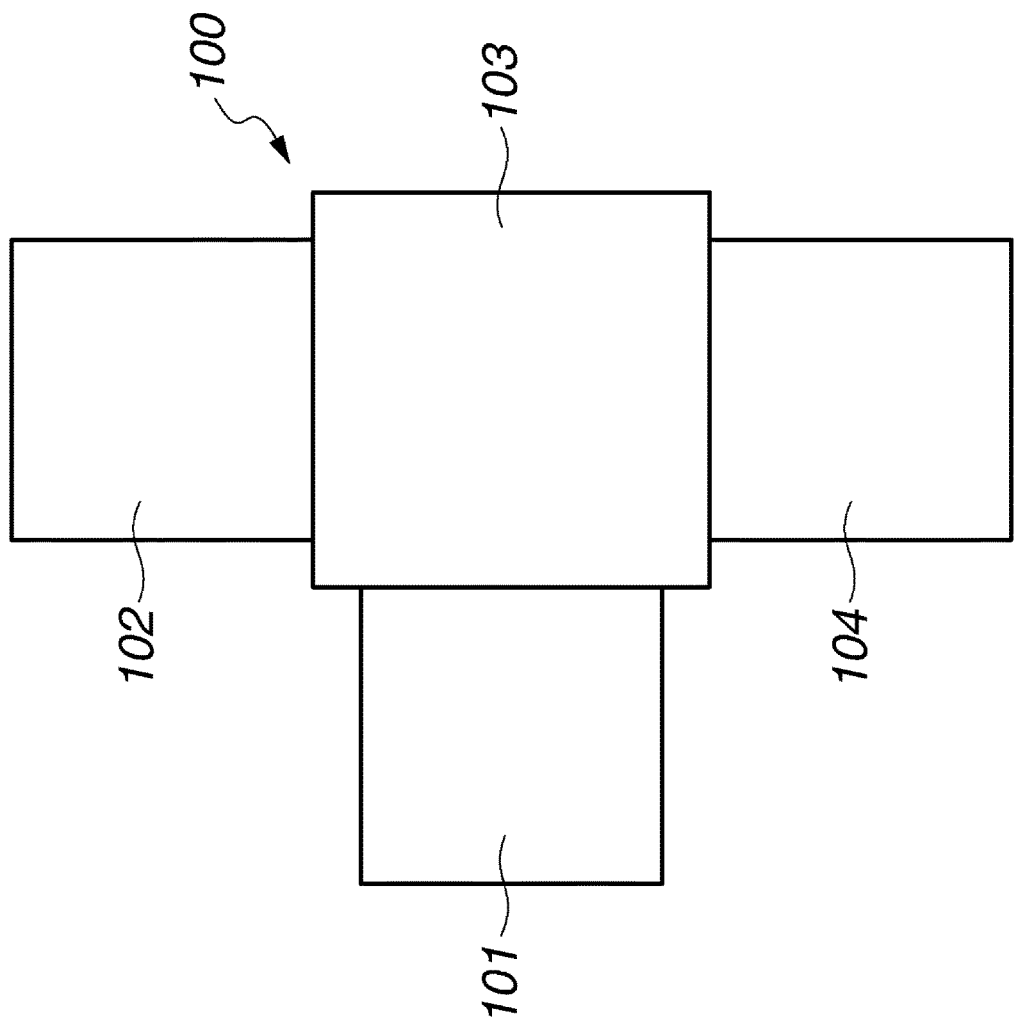
FIG. 4 is a conceptual diagram showing an example of a sputtering apparatus suitable for forming a multilayer reflection film of the invention.

FIG. 4 is a conceptual diagram showing an example of a sputtering apparatus suitable for forming a multilayer reflection film of the invention. The sputtering apparatus 100 is configured by a sputter chamber 101 for forming the Si/Mo laminated portion by sputtering, a sputter chamber 102 for forming the protection layer by sputtering, a transfer chamber 103 communicating with each of the sputter chambers 101, 102, and a load lock chamber 104 communicating with the transfer chamber 103. An openable and closable bulkhead (not shown) is provided between the transfer chamber 103 and the load lock chamber 104. Further, an openable and closable bulkhead is optionally provided between each of the sputter chambers 101, 102 and the transfer chamber 103.

When the multilayer reflection film is formed by such a sputtering apparatus, for example, first, a substrate is introduced into the load lock chamber 104, the pressure inside the load lock chamber 104 is reduced, the bulkhead is opened, the substrate is transferred via the transfer chamber 103 to the sputter chamber 101, then, the Si/Mo laminated portion is formed in the sputter chamber 101. Next, the substrate on which the Si/Mo laminated portion has been formed is transferred from the sputter chamber 101 via the transfer chamber 103 to the sputter chamber 102, then the protection layer is formed in the sputter chamber 102. Next, the substrate on which the Si/Mo laminated portion and the protection layer (multilayer reflection film) has been formed is transferred from the sputter chamber 102 via the transfer chamber 103 to the load lock chamber 104, the bulkhead is closed, the pressure of inside of the road lock chamber 104 is returned to normal pressure, then the substrate on which the multilayer reflection film is formed is taken out. By such a way, a substrate with a multilayer reflection film for an EUV mask blank can be obtained. When the multilayer reflection film is formed in this way, the step (B) can be performed without contacting the Si/Mo laminated portion formed in the step (A) with gases which are reactable to the Mo/Si laminated portion.

To manufacture an EUV mask blank, an absorber film is formed on the multilayer reflection film of the substrate with a multilayer reflection film for an EUV mask blank.

The EUV mask blank of the invention includes an absorber film that is formed on the multilayer reflection film of the substrate with a multilayer reflection film for an EUV mask blank, and absorbs exposure light, specifically, an absorber film that absorbs EUV light and reduces a reflectance. The absorber film is preferably formed in contact with the protection layer. The EUV mask blank may further includes, on the absorber film, a hard mask film that acts as an etching mask for dry etching the absorber film. On the other hand, a conductive film may be formed on the other main surface (back side surface) of the substrate which is the opposite side to the one main surface, preferably in contact with the substrate. The conductive film is used for holding an EUV mask on an exposure tool by an electrostatic chuck. In the invention, one main surface of the substrate is defined as the front side or the upper side, and the other main surface is defined as the back side or the lower side. However, the front and back sides or the upper and lower sides in both surfaces are defined for the sake of convenience. Two main surfaces (film forming surfaces) are one and the other main surfaces, respectively. The front and back sides or the upper and lower sides may be substituted.

From the EUV mask blank (a mask blank for EUV exposure), an EUV mask (a mask for EUV exposure) including an absorber pattern (a pattern of the absorber film) formed by patterning the absorber film is manufactured. The EUV mask blank and the EUV mask are a reflective mask blank and a reflective mask, respectively.

The absorber film is formed on the multilayer film, and is a film that absorbs EUV light as an exposure light and reduces reflectance of the exposure light. A transfer pattern in an EUV mask is formed by a difference of reflectance between a portion on which the absorber film is formed and a portion on which the absorber film is not formed.

A material of the absorber film is not limited as long as a material can absorb EUV light and is processible to a pattern. Examples of the material of the absorber film include, for example, a material containing tantalum (Ta) or chromium (Cr). The material containing Ta or Cr may contain oxygen (O), nitrogen (N), carbon (C), boron (B), or other elements. Examples of the material containing Ta include, for example, Ta simple substance, and a tantalum compound such as TaO, TaN, TaON, TaC, TaCN, TaCO, TaCON, TaB, TaOB, TaNB, TaONB, TaCB, TaCNB, TaCOB and TaCONB. Examples of the material containing Cr include, for example, Cr simple substance, and a chromium compound such as CrO, CrN, CrON, CrC, CrCN, CrCO, CrCON, CrB, CrOB, CrNB, CrONB, CrCB, CrCNB, CrCOB and CrCONB.

The absorber film can be formed by a sputtering method, and the sputtering is preferably a magnetron sputtering. In particular, the absorber film is formed by using a metal target such as a chromium (Cr) target and a tantalum (Ta) target or a metal compound target such as a chromium compound target and a tantalum compound target (a target containing a metal such as Cr and Ta, and at least one selected from the group consisting of oxygen (O), nitrogen (N), carbon (C), boron (B) and the like); and using, as a sputter gas, a rare gas such as helium (He) gas, argon (Ar) gas, krypton (Kr) gas and xenon (Xe) gas in sputtering, or using the rare gas with a reactive gas such as an oxygen-containing gas, a nitrogen-containing gas and a carbon-containing gas in a reactive sputtering.

On the side of absorber film that is remote from the substrate, a hard mask film (an etching mask film for the absorber film) having different etching properties from the absorber film may be provided preferably in contact with the absorber film. The hard mask film is a film that acts as an etching mask when an absorber film is etched by dry etching. After the absorber pattern is formed, the hard mask film may be left as the reflectance reducing film for reducing the reflectance at the wavelength of light used in inspections such as pattern inspection as a part of the absorber film, or removed to be absent on the reflective mask. Examples of the material of the hard mask film include a material containing chromium (Cr). A hard mask film composed of a material containing Cr is more preferable in case that the absorber film is composed of a material containing Ta and free of Cr. When a layer that mainly has a function for reducing the reflectance at the wavelength of light used in inspection such as pattern inspection (the reflectance reducing layer) is formed on the absorber film, the hard mask film may be formed on the reflectance reducing film of the absorber film. The hard mask film may be formed by, for example, a magnetron sputtering method. A thickness of the hard mask is normally about 5 to 20 nm, however, not limited thereto.

A sheet resistance of the conductive film is preferably not more than 100Ω/□, and a material of the conductive film are not particularly limited. Examples of the material of the conductive film include, for example, a material containing tantalum (Ta) or chromium (Cr). The material containing Ta or Cr may contain oxygen (O), nitrogen (N), carbon (C), boron (B), or other elements. Examples of the material containing Ta include, for example, Ta simple substance, and a tantalum compound such as TaO, TaN, TaON, TaC, TaCN, TaCO, TaCON, TaB, TaOB, TaNB, TaONB, TaCB, TaCNB, TaCOB and TaCONB. Examples of the material containing Cr include, for example, Cr simple substance, and a chromium compound such as CrO, CrN, CrON, CrC, CrCN, CrCO, CrCON, CrB, CrOB, CrNB, CrONB, CrCB, CrCNB, CrCOB and CrCONB.

A thickness of the conductive film is not particularly limited as long as the conductive film has a function for an electrostatic chuck use. The thickness is normally about 5 to 100 nm. The thickness of the conductive film is preferably formed so that a film stress is balanced with the multilayer reflection film and the absorber pattern after an EUV mask is obtained, that is, after the absorber pattern is formed. The conductive film may be formed before forming the multilayer reflection film, or after forming all of the films disposed at the side of the multilayer reflection film on the substrate. Further, the conductive film may be formed after forming a part of the films disposed at the side of the multilayer reflection film on the substrate, and then the remainder of the films disposed at the side of the multilayer reflection film on the substrate may be formed. The conductive film may be formed by, for example, a magnetron sputtering method.

Further, the EUV mask blank may include a resist film formed on the side remotest from the substrate. The resist film is preferably an electron beam (EB) resist.

EXAMPLES

Examples of the invention are given below by way of illustration and not by way of limitation.

Example 1

A multilayer reflection film consisting of a Si/Mo laminated portion and a protection layer containing Ru was formed on a substrate. The substrate was composed of a low thermal expansion material having a coefficient of thermal expansion within the range of $\pm 5.0 \times 10^{-9}/°$ C., a surface roughness of the main surface of not more than 0.1 nm in RMS value, and a flatness of the main surface of 100 nm in TIR value.

The Si/Mo laminated portion was formed by magnetron sputtering using a Si target and a Mo target as targets, and Ar gas and $N_2$ gas as sputter gases. One Si target and one Mo target were attached to a magnetron sputtering apparatus, the substrate and each target were arranged in an offset arrangement, and the substrate was rotated. First, a Si layer was formed at a setting thickness of 3.5 nm by introducing only Ar gas into a sputter chamber, and discharging only the Si target. Next, a SiN layer was formed at a setting thickness of 0.5 nm by introducing Ar gas and $N_2$ gas into the sputter chamber, and discharging only the Si target. Next, a Mo layer was formed at a setting thickness of 3.0 nm by introducing only Ar gas into the sputter chamber, and discharging only the Mo target. A cycle of the formations of these three layers, the Si layer, the SiN layer and the Mo layer, as one cycle, was repeated for a total of 40 cycles. Then, a SiN layer was formed at a setting thickness of 0.5 nm by introducing Ar gas and $N_2$ gas into the sputter chamber, and discharging only the Si target. Next, a Si layer was formed at a setting thickness of 2.3 nm by introducing only Ar gas into the sputter chamber, and discharging only the Si target. Next, a SiN layer was formed at a setting thickness of 0.5 nm by introducing Ar gas and $N_2$ gas into the sputter chamber, and discharging only the Si target. Next, a Mo layer was formed at a setting thickness of 0.5 nm by introducing only Ar gas into the sputter chamber, and discharging only the Mo target.

The protection layer was formed by magnetron sputtering using a Ru target and a Nd target as targets, and Ar gas as a sputter gas. One Ru target and one Nb target were attached to another magnetron sputtering apparatus which differs from the magnetron sputtering apparatus used for forming the Si/Mo laminated portion, the substrate and each target were arranged in an offset arrangement, and the substrate was rotated. The substrate on which the Si/Mo laminated portion has been formed was transferred under vacuum from the magnetron sputtering apparatus used for forming the Si/Mo laminated portion to the other magnetron sputtering apparatus used for forming the protection layer via a transfer chamber that communicates with both sputter chambers. First, a Ru layer as a lower layer was formed at a setting thickness of 2.0 nm by introducing Ar gas into the sputter chamber, and discharging only the Ru target. Next, a RuNb mixed layer as an upper layer was formed at a setting thickness of 0.5 nm by introducing Ar gas into the sputter chamber, and discharging simultaneously the Ru target and the Nb target, obtaining the protection layer consisting of two layers.

When the cross section of the obtained multilayer reflection film was observed by a transmission electron microscope (TEM), from the surface side (the side remote from the substrate), a RuNb mixed layer having a thickness of 0.5 nm, a Ru layer having a thickness of 2.0 nm, a Mo layer having a thickness of 0.5 nm, a SiN layer having a thickness of 0.5 nm, a Si layer having a thickness of 2.3 nm, a SiN layer having a thickness of 0.5 nm, a Mo layer having a thickness 3.0 nm, and a SiN layer having a thickness of 0.5 nm were observed in this order at the upper portion of the multilayer reflection film. Further, the multilayer reflection film obtained by the same method was heat-treated at 200° C. for 10 minutes in air atmosphere. When the cross section of the multilayer reflection film was observed in the same manner, the observed multilayer reflection film was similar to that not heat-treated. Further, when a peak reflectance of EUV light in the wavelength range of 13.4 to 13.6 nm at an incident angle of 6° was measured before and after the heat treatment. The results were 67% before the heat treatment and 65% after the heat treatment that satisfy a high reflectance of not less than 65%.

Example 2

A multilayer reflection film consisting of a Si/Mo laminated portion and a protection layer containing Ru was formed on a substrate. The substrate was composed of a low thermal expansion material having a coefficient of thermal expansion within the range of $\pm 5.0 \times 10^{-9}/°$ C., a surface roughness of the main surface of not more than 0.1 nm in RMS value, and a flatness of the main surface of 100 nm in TIR value.

The Si/Mo laminated portion was formed by magnetron sputtering using a Si target and a Mo target as targets, and Ar gas and $N_2$ gas as sputter gases. One Si target and one Mo target were attached to a magnetron sputtering apparatus, the substrate and each target were arranged in an offset arrangement, and the substrate was rotated. First, a Si layer was formed at a setting thickness of 3.5 nm by introducing only Ar gas into a sputter chamber, and discharging only the Si target. Next, a SiN layer was formed at a setting thickness of 0.5 nm by introducing Ar gas and $N_2$ gas into the sputter chamber, and discharging only the Si target. Next, a Mo layer was formed at a setting thickness of 3.0 nm by introducing only Ar gas into the sputter chamber, and discharging only the Mo target. A cycle of the formations of these three layers, the Si layer, the SiN layer and the Mo layer, as one cycle, was repeated for a total of 40 cycles. Then, a SiN layer was formed at a setting thickness of 0.5 nm by introducing Ar gas and $N_2$ gas into the sputter chamber, and discharging only the Si target. Next, a Si layer was formed at a setting thickness of 2.3 nm by introducing only Ar gas into the sputter chamber, and discharging only the Si target. Next, a SiN layer was formed at a setting thickness of 0.5 nm by introducing Ar gas and $N_2$ gas into the sputter chamber, and discharging only the Si target. Next, a Mo layer was formed at a setting thickness of 0.5 nm by introducing only Ar gas into the sputter chamber, and discharging only the Mo target.

The protection layer was formed by magnetron sputtering using a Ru target and a Nd target as targets, and Ar gas as a sputter gas. One Ru target and one Nb target were attached to another magnetron sputtering apparatus which differs from the magnetron sputtering apparatus used for forming the Si/Mo laminated portion, the substrate and each target were arranged in an offset arrangement, and the substrate was rotated. The substrate on which the Si/Mo laminated portion has been formed was transferred under vacuum from the magnetron sputtering apparatus used for forming the Si/Mo laminated portion to the other magnetron sputtering apparatus used for forming the protection layer via a transfer chamber that communicates with both sputter chambers. First, a Ru layer as a lower layer was formed at a setting thickness of 1.0 nm by introducing Ar gas into the sputter chamber, and discharging only the Ru target. Next, a RuNb mixed layer as an upper layer was formed at a setting thickness of 1.5 nm by introducing Ar gas into the sputter chamber, and discharging simultaneously the Ru target and the Nb target, obtaining the protection layer consisting of two layers. At this time, the power applied to the Nb target was gradually increased to form a graded composition in which the Nb content continuously increases to the side remote from the substrate in the thickness direction.

When the cross section of the obtained multilayer reflection film was observed by a transmission electron microscope (TEM), from the surface side (the side remote from the substrate), a RuNb mixed layer having a thickness of 1.5 nm, a Ru layer having a thickness of 1.0 nm, a Mo layer having a thickness of 0.5 nm, a SiN layer having a thickness of 0.5 nm, a Si layer having a thickness of 2.3 nm, a SiN layer having a thickness of 0.5 nm, a Mo layer having a thickness 3.0 nm, and a SiN layer having a thickness of 0.5 nm were observed in this order at the upper portion of the multilayer reflection film. Further, the multilayer reflection film obtained by the same method was heat-treated at 200° C. for 10 minutes in air atmosphere. When the cross section of the multilayer reflection film was observed in the same manner, the observed multilayer reflection film was similar to that not heat-treated. Further, when a peak reflectance of EUV light in the wavelength range of 13.4 to 13.6 nm at an incident angle of 6° was measured before and after the heat treatment. The results were 67% before the heat treatment and 65% after the heat treatment that satisfy a high reflectance of not less than 65%.

Example 3

A multilayer reflection film consisting of a Si/Mo laminated portion and a protection layer containing Ru was formed on a substrate. The substrate was composed of a low thermal expansion material having a coefficient of thermal expansion within the range of $\pm 5.0 \times 10^{-9}/°$ C., a surface roughness of the main surface of not more than 0.1 nm in RMS value, and a flatness of the main surface of 100 nm in TIR value.

The Si/Mo laminated portion was formed by magnetron sputtering using a Si target and a Mo target as targets, and Ar gas and $N_2$ gas as sputter gases. One Si target and one Mo target were attached to a magnetron sputtering apparatus, the substrate and each target were arranged in an offset arrangement, and the substrate was rotated. First, a Si layer was formed at a setting thickness of 3.5 nm by introducing only Ar gas into a sputter chamber, and discharging only the Si target. Next, a SiN layer was formed at a setting thickness of 0.5 nm by introducing Ar gas and $N_2$ gas into the sputter chamber, and discharging only the Si target. Next, a Mo layer was formed at a setting thickness of 3.0 nm by introducing only Ar gas into the sputter chamber, and discharging only the Mo target. A cycle of the formations of these three layers, the Si layer, the SiN layer and the Mo layer, as one cycle, was repeated for a total of 40 cycles.

Then, a SiN layer was formed at a setting thickness of 0.5 nm by introducing Ar gas and $N_2$ gas into the sputter chamber, and discharging only the Si target. Next, a Si layer was formed at a setting thickness of 2.3 nm by introducing only Ar gas into the sputter chamber, and discharging only the Si target. Next, a SiN layer was formed at a setting thickness of 0.5 nm by introducing Ar gas and $N_2$ gas into the sputter chamber, and discharging only the Si target. Next, a Mo layer was formed at a setting thickness of 0.5 nm by introducing only Ar gas into the sputter chamber, and discharging only the Mo target.

The protection layer was formed by magnetron sputtering using a Ru target and a Nd target as targets, and Ar gas and $O_2$ gas as sputter gases. One Ru target and one Nb target were attached to another magnetron sputtering apparatus which differs from the magnetron sputtering apparatus used for forming the Si/Mo laminated portion, the substrate and each target were arranged in an offset arrangement, and the substrate was rotated. The substrate on which the Si/Mo laminated portion has been formed was transferred under vacuum from the magnetron sputtering apparatus used for forming the Si/Mo laminated portion to the other magnetron sputtering apparatus used for forming the protection layer via a transfer chamber that communicates with both sputter chambers. First, a Ru layer as a lower layer was formed at a setting thickness of 1.0 nm by introducing only Ar gas into the sputter chamber, and discharging only the Ru target. Next, a RuNbO mixed layer as an upper layer was formed at a setting thickness of 1.5 nm by introducing Ar gas and $O_2$ gas into the sputter chamber, and discharging simultaneously the Ru target and the Nb target, obtaining the protection layer consisting of two layers. At this time, the power applied to the Nb target was gradually increased to form a graded composition in which the Nb content continuously increases to the side remote from the substrate in the thickness direction.

When the cross section of the obtained multilayer reflection film was observed by a transmission electron microscope (TEM), from the surface side (the side remote from the substrate), a RuNbO mixed layer having a thickness of 1.5 nm, a Ru layer having a thickness of 1.0 nm, a Mo layer having a thickness of 0.5 nm, a SiN layer having a thickness of 0.5 nm, a Si layer having a thickness of 2.3 nm, a SiN layer having a thickness of 0.5 nm, a Mo layer having a thickness 3.0 nm, and a SiN layer having a thickness of 0.5 nm were observed in this order at the upper portion of the multilayer reflection film. Further, the multilayer reflection film obtained by the same method was heat-treated at 200° C. for 10 minutes in air atmosphere. When the cross section of the multilayer reflection film was observed in the same manner, the observed multilayer reflection film was similar to that not heat-treated. Further, when a peak reflectance of EUV light in the wavelength range of 13.4 to 13.6 nm at an incident angle of 6° was measured before and after the heat treatment. The results were 67% before the heat treatment and 65% after the heat treatment that satisfy a high reflectance of not less than 65%.

Comparative Example 1

A multilayer reflection film consisting of a Si/Mo laminated portion and a protection layer containing Ru was formed on a substrate. The substrate was composed of a low thermal expansion material having a coefficient of thermal expansion within the range of $\pm 5.0 \times 10^{-9}/°$ C., a surface roughness of the main surface of not more than 0.1 nm in RMS value, and a flatness of the main surface of 100 nm in TIR value.

The Si/Mo laminated portion was formed by magnetron sputtering using a Si target and a Mo target as targets, and Ar gas as a sputter gas. One Si target and one Mo target were attached to a magnetron sputtering apparatus, the substrate and each target were arranged in an offset arrangement, and the substrate was rotated. First, a Si layer was formed at a setting thickness of 4.0 nm by introducing Ar gas into a sputter chamber, and discharging only the Si target. Next, a Mo layer was formed at a setting thickness of 3.0 nm by introducing Ar gas into the sputter chamber, and discharging only the Mo target. A cycle of the formations of these two layers, the Si layer and the Mo layer, as one cycle, was repeated for a total of 40 cycles. Then, a Si layer was formed at a setting thickness of 3.0 nm by introducing Ar gas into the sputter chamber, and discharging only the Si target.

The protection layer was formed by magnetron sputtering using a Ru target and a Nd target as targets, and Ar gas as a sputter gas. One Ru target and one Nb target were attached to another magnetron sputtering apparatus which differs from the magnetron sputtering apparatus used for forming the Si/Mo laminated portion, the substrate and each target were arranged in an offset arrangement, and the substrate was rotated. The substrate on which the Si/Mo laminated portion has been formed was transferred under vacuum from the magnetron sputtering apparatus used for forming the Si/Mo laminated portion to the other magnetron sputtering apparatus used for forming the protection layer via a transfer chamber that communicates with both sputter chambers. A RuNb mixed layer was formed at a setting thickness of 3.5 nm by introducing Ar gas into the sputter chamber, and discharging simultaneously the Ru target and the Nb target, obtaining the protection layer.

When the cross section of the obtained multilayer reflection film was observed by a transmission electron microscope (TEM), from the surface side (the side remote from the substrate), a RuNb mixed layer having a thickness of 2.5 nm, an interdiffusion layer having a thickness of 1.5 nm in which Si and Ru are mixed, a Si layer having a thickness of 2.5 nm, an interdiffusion layer having a thickness of 0.5 nm in which Si and Mo are mixed, a Mo layer having a thickness 2.5 nm, and an interdiffusion layer having a thickness of 1.5 nm in which Si and Mo are mixed were observed in this order at the upper portion of the multilayer reflection film. Further, the multilayer reflection film obtained by the same method was heat-treated at 200° C. for 10 minutes in air atmosphere. When the cross section of the multilayer reflection film was observed in the same manner, from the surface side (the side remote from the substrate), a RuNb mixed layer having a thickness of 2 nm, a SiO layer having a thickness of 2 nm, a RuNbSi mixed layer having a thickness of 2 nm, a Si layer having a thickness of 1.0 nm, an interdiffusion layer having a thickness of 0.5 nm in which Si and Mo are mixed, a Mo layer having a thickness 2.0 nm, and an interdiffusion layer having a thickness of 2.0 nm in which Si and Mo are mixed were observed in this order at the upper portion of the multilayer reflection film. In this case, the SiO layer that was generated by a reaction of the Si layer with oxygen in the air which passed though the RuNd mixed layer was formed. Further, when a peak reflectance of EUV light in the wavelength range of 13.4 to 13.6 nm at an incident angle of 6° was measured before and after the heat treatment. The results were 64% before the heat treatment and 60% after the heat treatment, and each was a low reflectance of less than 65%.

Comparative Example 2

A multilayer reflection film consisting of a Si/Mo laminated portion and a protection layer containing Ru was formed on a substrate. The substrate was composed of a low thermal expansion material having a coefficient of thermal expansion within the range of $\pm 5.0 \times 10^{-9}$/° C., a surface roughness of the main surface of not more than 0.1 nm in RMS value, and a flatness of the main surface of 100 nm in TIR value.

The Si/Mo laminated portion was formed by magnetron sputtering using a Si target and a Mo target as targets, and Ar gas as a sputter gas. One Si target and one Mo target were attached to a magnetron sputtering apparatus, the substrate and each target were arranged in an offset arrangement, and the substrate was rotated. First, a Si layer was formed at a setting thickness of 4.0 nm by introducing Ar gas into a sputter chamber, and discharging only the Si target. Next, a Mo layer was formed at a setting thickness of 3.0 nm by introducing Ar gas into the sputter chamber, and discharging only the Mo target. A cycle of the formations of these two layers, the Si layer and the Mo layer, as one cycle, was repeated for a total of 40 cycles. Then, a Si layer was formed at a setting thickness of 4.0 nm by introducing Ar gas into the sputter chamber, and discharging only the Si target. Next, a Mo layer was formed at a setting thickness of 1.0 nm by introducing Ar gas into the sputter chamber, and discharging only the Mo target.

The protection layer was formed by magnetron sputtering using a Ru target and a Nd target as targets, and Ar gas as a sputter gas. One Ru target and one Nb target were attached to another magnetron sputtering apparatus which differs from the magnetron sputtering apparatus used for forming the Si/Mo laminated portion, the substrate and each target were arranged in an offset arrangement, and the substrate was rotated. The substrate on which the Si/Mo laminated portion has been formed was transferred under vacuum from the magnetron sputtering apparatus used for forming the Si/Mo laminated portion to the other magnetron sputtering apparatus used for forming the protection layer via a transfer chamber that communicates with both sputter chambers. A RuNb mixed layer was formed at a setting thickness of 2.0 nm by introducing Ar gas into the sputter chamber, and discharging simultaneously the Ru target and the Nb target, obtaining the protection layer.

When the cross section of the obtained multilayer reflection film was observed by a transmission electron microscope (TEM), from the surface side (the side remote from the substrate), a RuNb mixed layer having a thickness of 2.0 nm, a Mo layer having a thickness of 1.0 nm, an interdiffusion layer having a thickness of 1.5 nm in which Si and Mo are mixed, a Si layer having a thickness of 3.5 nm, an interdiffusion layer having a thickness of 0.5 nm in which Si and Mo are mixed, and a Mo layer having a thickness 2.5 nm were observed in this order at the upper portion of the multilayer reflection film. However, no interdiffusion layer was formed between the RuNb mixed layer and the Mo layer. Further, the multilayer reflection film obtained by the same method was heat-treated at 200° C. for 10 minutes in air atmosphere. When the cross section of the multilayer reflection film was observed in the same manner, from the surface side (the side remote from the substrate), a RuNb mixed layer having a thickness of 2 nm, a SiO layer having a thickness of 2 nm, an interdiffusion layer having a thickness of 1.0 nm in which Si and Mo are mixed, a Si layer having a thickness of 1.5 nm, an interdiffusion layer having a thickness of 0.5 nm in which Si and Mo are mixed, a Mo layer having a thickness 2.5 nm, and an interdiffusion layer having a thickness of 1.5 nm in which Si and Mo are mixed were observed in this order at the upper portion of the multilayer reflection film. In this case, the SiO layer that was generated by a reaction of the Si layer with oxygen in the air which passed though the RuNd mixed layer was formed. Further, when a peak reflectance of EUV light in the wavelength range of 13.4 to 13.6 nm at an incident angle of 6° was measured before and after the heat treatment. The results were 64% before the heat treatment and 62% after the heat treatment, and each was a low reflectance of less than 65%.

Comparative Example 3

A multilayer reflection film consisting of a Si/Mo laminated portion and a protection layer containing Ru was formed on a substrate. The substrate was composed of a low thermal expansion material having a coefficient of thermal expansion within the range of $\pm 5.0 \times 10^{-9}/°$ C., a surface roughness of the main surface of not more than 0.1 nm in RMS value, and a flatness of the main surface of 100 nm in TIR value.

The Si/Mo laminated portion was formed by magnetron sputtering using a Si target and a Mo target as targets, and Ar gas as a sputter gas. One Si target and one Mo target were attached to a magnetron sputtering apparatus, the substrate and each target were arranged in an offset arrangement, and the substrate was rotated. First, a Si layer was formed at a setting thickness of 4.0 nm by introducing Ar gas into a sputter chamber, and discharging only the Si target. Next, a Mo layer was formed at a setting thickness of 3.0 nm by introducing Ar gas into the sputter chamber, and discharging only the Mo target. A cycle of the formations of these two layers, the Si layer and the Mo layer, as one cycle, was repeated for a total of 40 cycles. Then, a Si layer was formed at a setting thickness of 3.0 nm by introducing Ar gas into the sputter chamber, and discharging only the Si target. Next, a Mo layer was formed at a setting thickness of 1.0 nm by introducing Ar gas into the sputter chamber, and discharging only the Mo target.

The protection layer was formed by magnetron sputtering using a Ru target as a target, and Ar gas as a sputter gas. One Ru target was attached to another magnetron sputtering apparatus which differs from the magnetron sputtering apparatus used for forming the Si/Mo laminated portion, the substrate was faced to the target, and the substrate was rotated. The substrate on which the Si/Mo laminated portion has been formed was transferred under vacuum from the magnetron sputtering apparatus used for forming the Si/Mo laminated portion to the other magnetron sputtering apparatus used for forming the protection layer via a transfer chamber that communicates with both sputter chambers. A Ru layer was formed at a setting thickness of 2.5 nm by introducing Ar gas into the sputter chamber, and discharging the Ru target, obtaining the protection layer.

When the cross section of the obtained multilayer reflection film was observed by a transmission electron microscope (TEM), from the surface side (the side remote from the substrate), a Ru layer having a thickness of 2.5 nm, an interdiffusion layer having a thickness of 1.2 nm in which Si and Mo are mixed, a Si layer having a thickness of 2.8 nm, an interdiffusion layer having a thickness of 0.5 nm in which Si and Mo are mixed, a Mo layer having a thickness 2.7 nm, and an interdiffusion layer having a thickness of 1.3 nm in which Si and Mo are mixed were observed in this order at the upper portion of the multilayer reflection film. Further, the multilayer reflection film obtained by the same method was heat-treated at 200° C. for 10 minutes in air atmosphere. When the cross section of the multilayer reflection film was observed in the same manner, from the surface side (the side remote from the substrate), a Ru layer having a thickness of 2.5 nm, an interdiffusion layer having a thickness of 1.6 nm in which Si and Mo are mixed, a Si layer having a thickness of 2.6 nm, an interdiffusion layer having a thickness of 0.5 nm in which Si and Mo are mixed, a Mo layer having a thickness of 2.6 nm, and an interdiffusion layer having a thickness of 1.6 nm in which Si and Mo are mixed were observed in this order at the upper portion of the multilayer reflection film. Further, when a peak reflectance of EUV light in the wavelength range of 13.4 to 13.6 nm at an incident angle of 6° was measured before and after the heat treatment. The results were 65% before the heat treatment and 62% after the heat treatment, and the reflectance was a low reflectance of less than 65% in the case after the heat treatment.

Japanese Patent Application No. 2020-151709 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A substrate with a multilayer reflection film for an EUV mask blank comprising a substrate, and a multilayer reflection film formed on the substrate, wherein
   the multilayer reflection film comprises a Si/Mo laminated portion in which Si layers and Mo layers are alternately laminated, and a protection layer containing Ru formed on the Si/Mo laminated portion and in contact with the Si/Mo laminated portion, as the uppermost layer,
   the protection layer comprises a lower layer formed in contact with the Si/Mo laminated portion, and an upper layer formed at the side remotest from the substrate,
   the lower layer is composed of Ru,
   the upper layer is composed of a material containing Ru and at least one selected from the group consisting of metals other than Ru, and metalloids,
   the protection layer is contact with the Mo layer of the Si/Mo laminated portion, and
   the uppermost part of the multilayer reflection film consists of, from the side remote from the substrate, the protection layer, the Mo layer, a layer containing Si and N, and the Si layer.

2. The substrate of claim 1, wherein the metals other than Ru are transition metals having a low standard oxidation-reduction potential compared with that of Ru.

3. The substrate of claim 1, wherein the upper layer is composed of a material containing Ru and at least one selected from the group consisting of Nb, Zr, Ti, Cr and Si.

4. The substrate of claim 1, wherein the upper layer is composed of a material containing Ru and at least one selected from the group consisting of metals and metalloids that have a low etching rate compared with that of Ru in a dry etching using an etching gas containing $O_2$ gas and $Cl_2$ gas.

5. The substrate of claim 1, wherein the upper layer has a graded composition in which a content of the metal or metalloid continuously increases to the side remote from the substrate in the thickness direction of the upper layer, or the upper layer consists of two or more of sublayers and has a graded composition in which contents of the metal or metalloid of the sublayers increase in stepwise to the side remote from the substrate in the thickness direction of the upper layer.

6. The substrate of claim 1, wherein the upper layer further contains oxygen.

7. The substrate of claim 1, wherein a layer containing Si and N intervenes at one or more portions between the Si layer and the Mo layer of the Si/Mo laminated portion, and is contact with both of the Si layer and the Mo layer.

8. The substrate of claim 7, wherein the layer containing Si and N has a thickness of not more than 2 nm.

9. The substrate of claim 1, wherein in the uppermost part, the protection layer has a thickness of not more than 4 nm, the Mo layer has a thickness of not more than 1 nm, the layer containing Si and N has a thickness of not more than 2 nm, and the Si layer has a thickness of not more than 4 nm.

10. The substrate of claim 1, wherein the Si/Mo laminated portion comprises not less than 30 of three-layer laminated structure units, and the three-layer laminated structure unit consists of, from the substrate side,
   i) the Si layer, a layer containing Si and N formed in contact with the Si layer, and the Mo layer formed in contact with the layer containing Si and N, or;
   ii) the Mo layer, a layer containing Si and N formed in contact with the Mo layer, and the Si layer formed in contact with the layer containing Si and N.

11. The substrate of claim 1, wherein the Si/Mo laminated portion comprises not less than 30 of four-layer laminated structure units, and the four-layer laminated structure unit consists of, from the substrate side, the Si layer, a layer containing Si and N formed in contact with the Si layer, the Mo layer formed in contact with the layer containing Si and N, and a layer containing Si and N formed in contact with the Mo layer.

12. The substrate of claim 1, wherein the multilayer reflection film has a peak reflectance of not less than 65% with respect to EUV light of the wavelength range of 13.4 to 13.6 nm at an incident angle of 6°.

13. A manufacturing method for the substrate with a multilayer reflection film for an EUV mask blank of claim 1, the method comprising the step of
   (A) forming the Si/Mo laminated portion by sputtering, wherein
   the sputtering is performed by a magnetron sputtering apparatus comprising a chamber, wherein in the chamber,
   one or more Mo targets and one or more Si targets are attachable;
   powers are individually applicable to the Mo target and the Si target;
   the substrate and each of the targets are disposed in offset arrangement;
   none of shield members are disposed between the substrate and each of the targets;
   the substrate is rotatable along its main surface; and
   nitrogen-containing gas is introducible.

14. A manufacturing method for the substrate with a multilayer reflection film for an EUV mask blank of claim 1, the method comprising the step of
   (B) forming the protection layer by sputtering, wherein
   the sputtering is performed by a magnetron sputtering apparatus comprising a chamber, wherein in the chamber,
   one or more Ru targets and one or more targets containing at least one selected from the group consisting of metals other than Ru, and metalloids are attachable;
   powers are individually applicable to the Ru target and the target containing at least one selected from the group consisting of metals other than Ru, and metalloids;
   the substrate and each of the targets are disposed in offset arrangement;
   none of shield members are disposed between the substrate and each of the targets;
   the substrate is rotatable along its main surface; and
   oxygen-containing gas is introducible.

15. A manufacturing method for the substrate with a multilayer reflection film for an EUV mask blank of claim 1 comprising a substrate, and a multilayer reflection film formed on the substrate, the multilayer reflection film comprising a Si/Mo laminated portion in which Si layers and Mo layers are alternately laminated, and a protection layer containing Ru formed on the Si/Mo laminated portion and in contact with the Si/Mo laminated portion,
   the method comprising the steps of
   (A) forming the Si/Mo laminated portion by sputtering, and
   (B) forming the protection layer by sputtering, wherein after the step (A), the Mo/Si laminated portion is provided to the step (B) without contacting to gases reactable to the Mo/Si laminated portion that has been formed in the step (A).

16. The manufacturing method of claim 15, wherein the step (A) is performed in one sputter chamber, the substrate on which the Mo/Si laminated portion has been formed is transferred to the other sputter chamber, and then, the step (B) is performed in the other sputter chamber.

17. The manufacturing method of claim 16, wherein a transfer chamber is provided between said one and other sputter chambers, the transfer chamber is capable of communicating with each of the sputter chambers individually or with both of the sputter chambers at the same time, and the substrate on which the Mo/Si laminated portion has been formed is transferred from said one sputter chamber via the transfer chamber to said other sputter chamber.

18. The manufacturing method of claim 17, wherein the substrate is transferred under vacuum both in the transfer from said one sputter chamber to the transfer chamber, and the transfer from the transfer chamber to said other sputter chamber.

19. An EUV mask blank comprising the substrate with a multilayer reflection film for an EUV mask blank of claim 1, and an absorber film containing Ta or Cr formed on the multilayer reflection film.

20. An EUV mask blank comprising the substrate with a multilayer reflection film for an EUV mask blank of claim 1, an absorber film containing Ta and being free of Cr formed on the multilayer reflection film, and a hard mask film which contains Cr and acts as an etching mask in dry etching for the absorber film.

21. The substrate of claim 1, wherein the Mo layer in the uppermost part has a thickness of not more than 1 nm.

22. A substrate with a multilayer reflection film for an EUV mask blank comprising a substrate, and a multilayer reflection film formed on the substrate, wherein
   the multilayer reflection film comprises a Si/Mo laminated portion in which Si layers and Mo layers are alternately laminated, and a protection layer containing Ru formed on the Si/Mo laminated portion and in contact with the Si/Mo laminated portion, as the uppermost layer,
   the protection layer comprises a lower layer formed in contact with the Si/Mo laminated portion, and an upper layer formed at the side remotest from the substrate, the lower layer is composed of Ru, the upper layer is composed of a material containing Ru and at least one selected from the group consisting of metals other than Ru, and metalloids, and a layer containing Si and N intervenes at one or more portions between the Si layer and the Mo layer of the Si/Mo laminated portion, and is contact with both of the Si layer and the Mo layer.

\* \* \* \* \*